United States Patent
Oka et al.

(10) Patent No.: US 10,028,377 B2
(45) Date of Patent: Jul. 17, 2018

(54) RESIN COMPOSITION, PREPREG AND METAL FOIL-CLAD LAMINATE

(75) Inventors: Naoki Oka, Tokyo (JP); Syouichi Itoh, Tokyo (JP); Masataka Kudo, Tokyo (JP); Michio Yaginuma, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 1132 days.

(21) Appl. No.: 14/348,266

(22) PCT Filed: Aug. 24, 2012

(86) PCT No.: PCT/JP2012/071447
§ 371 (c)(1),
(2), (4) Date: Aug. 28, 2014

(87) PCT Pub. No.: WO2013/047041
PCT Pub. Date: Apr. 4, 2013

(65) Prior Publication Data
US 2014/0370771 A1    Dec. 18, 2014

(30) Foreign Application Priority Data
Sep. 30, 2011    (JP) ................. 2011-216480

(51) Int. Cl.
C08F 299/02    (2006.01)
H05K 1/03    (2006.01)
C08J 5/24    (2006.01)
C08L 71/12    (2006.01)

(52) U.S. Cl.
CPC ......... *H05K 1/0373* (2013.01); *C08F 299/02* (2013.01); *C08J 5/24* (2013.01); *C08L 71/12* (2013.01); *C08L 71/126* (2013.01); *H05K 1/0366* (2013.01); *C08J 2363/00* (2013.01); *C08L 2203/20* (2013.01); *C08L 2205/03* (2013.01); *H05K 2201/0209* (2013.01); *Y10T 428/31529* (2015.04); *Y10T 442/2475* (2015.04); *Y10T 442/3423* (2015.04); *Y10T 442/3455* (2015.04)

(58) Field of Classification Search
CPC ................................... H05K 1/0373
See application file for complete search history.

(56) References Cited

U.S. PATENT DOCUMENTS

| | | |
|---|---|---|
| 2004/0146692 A1 | 7/2004 | Inoue et al. |
| 2004/0152848 A1 | 8/2004 | Ishii et al. |
| 2008/0004383 A1 | 1/2008 | Nakamura et al. |
| 2009/0247032 A1 | 10/2009 | Mori et al. |

FOREIGN PATENT DOCUMENTS

| | | | |
|---|---|---|---|
| CN | 1697796 | | 11/2005 |
| CN | 101550221 | | 10/2009 |
| EP | 1749812 | | 2/2007 |
| EP | 1749812 | A1 | 2/2007 |
| EP | 2049922 | A2 | 4/2009 |
| EP | 2090612 | A1 | 8/2009 |
| EP | 2113534 | A1 | 11/2009 |
| EP | 2230283 | A1 | 9/2010 |
| JP | 2004-231729 | * | 8/2004 |
| JP | 2005-112981 | * | 4/2005 |
| JP | 2005-336082 | A | 12/2005 |
| JP | 2008-303382 | * | 12/2008 |
| JP | 2009-096840 | * | 5/2009 |
| JP | 2009-542674 | * | 12/2009 |
| JP | 2010-077112 | * | 4/2010 |
| JP | 2010-111758 | * | 5/2010 |
| JP | 2010-138366 | * | 6/2010 |
| TW | 200948856 | A1 | 12/2009 |
| WO | 2008-147374 | A2 | 4/2008 |

OTHER PUBLICATIONS

International Search Report dated Nov. 20, 2012 in PCT/JP2012/071447.
International Preliminary Report on Patentability dated Apr. 1, 2014 in PCT/JP2012/071447.

* cited by examiner

*Primary Examiner* — Megan McCulley
(74) *Attorney, Agent, or Firm* — Greenblum & Bernstein, P.L.C.

(57) ABSTRACT

Provided are a resin composition having excellent electrical characteristics and heat resistance after moisture absorption, and being also excellent in flowing characteristics at the time of production of a laminate, and a prepreg, a metal foil-clad laminate and a resin sheet using the same. Used is a resin composition comprising a bifunctional phenylene ether oligomer (a) having a polyphenylene ether skeleton, an aralkyl-based cyanate ester compound (b), a bisphenol-based cyanate ester compound (c), an epoxy resin (d), a brominated carbonate oligomer (e), an inorganic filler (f), an alkoxynaphthol-based polymerization inhibitor (g) and/or a thioether-based polymerization inhibitor (h).

17 Claims, No Drawings

RESIN COMPOSITION, PREPREG AND METAL FOIL-CLAD LAMINATE

TECHNICAL FIELD

The present invention relates to a resin composition, and a prepreg, a metal foil-clad laminate and a resin sheet using the same, more specifically relates to a resin composition having excellent electrical characteristics and heat resistance after moisture absorption and being also excellent in formability, and capable of producing a printed-wiring board for high multilayer.

BACKGROUND ART

Recently, information terminal equipment including a personal computer and a server, and communications equipment such as an internet router and optical communication have been required to process high-volume information at a high speed, and the increases in speed and frequency of an electronic component have been made. In accordance with such increases, printed-wiring boards for use in such communications equipment have been demanded for having enhanced electrical characteristics in order to cope with a high frequency, and in particular, demanded for having a low dielectric constant and a low dielectric tangent.

As a material for printed-wiring boards excellent in dielectric characteristics, for example, a resin composition containing a bifunctional phenylene ether resin of a specific structure, a thermosetting resin, and a curing agent for the thermosetting resin is known (for example, see Patent Literature 1).

Printed-wiring boards are usually produced using a metal foil-clad laminate or the like produced by laminating with copper foil or the like a prepreg that is in the semi-cured state of a thermosetting resin composition, and pressurizing and heating the resulting laminated body. Therefore, the prepreg itself is demanded for having fluidity (flowing characteristics) at the time of pressurizing and heating (at the time of forming) at the time of production of a laminate, from the viewpoint of adhesion strength at the time of laminating.

When a polyphenylene ether resin is used as a resin component of the prepreg, the resin has a high molecular weight per unit structure, has a high viscosity (melt viscosity) when being applied heat to be molten, and thus has suffered from such a problem that flowing characteristics at the time of production of a laminate are insufficient.

In order to solve this problem, the present applicants have already reported a resin composition including a specific bifunctional phenylene ether oligomer, a naphthol aralkyl-based cyanate ester compound, a bisphenol A-based cyanate ester compound, a brominated flame retardant and an inorganic filler (for example, see Patent Literature 2).

CITATION LIST

Patent Literatures

Patent Literature 1: Japanese Patent Laid-Open No. 2005-112981
Patent Literature 2: Japanese Patent Laid-Open No. 2010-138366

SUMMARY OF INVENTION

Technical Problem

According to further studies by the present inventors, however, it has been found that when the prepreg or the like is highly multilayered in order to enhance electrical characteristics, such a problem of flowing characteristics at the time of production of a laminate is particularly remarkable. Therefore, flowing characteristics at the time of production of a laminate are demanded for being further improved. In particular, a resin composition containing a phenylene ether polymer as a main component has a relatively high melt viscosity, and thus, when the resin composition is used for providing a highly multilayered laminate, the significant improvement in flowing characteristics at the time of production of a laminate is demanded.

The present invention has been made in view of the above problems, and an object thereof is to provide a resin composition having excellent electrical characteristics and heat resistance after moisture absorption and being also excellent in flowing characteristics (formability) at the time of production of a laminate, as well as a prepreg, a metal foil-clad laminate and a resin sheet using the same.

Solution to Problem

The present inventors have made intensive studies in order to solve the problems, and as a result, have found that unexpectedly, a specific polymerization inhibitor is used for a resin composition comprising a specific phenylene ether oligomer, two specific cyanate ester compounds, an epoxy resin, a brominated carbonate oligomer and an inorganic filler to thereby enhance formability at the time of production of a laminate without electrical characteristics and heat resistance after moisture absorption excessively impaired, leading to the present invention.

That is, the present invention provides the following <1> to <18>.

<1> A resin composition comprising a bifunctional phenylene ether oligomer (a) having a polyphenylene ether skeleton, an aralkyl-based cyanate ester compound (b), a bisphenol-based cyanate ester compound (c), an epoxy resin (d), a brominated carbonate oligomer (e), an inorganic filler (f), an alkoxynaphthol-based polymerization inhibitor (g) and/or a thioether-based polymerization inhibitor (h).

<2> The resin composition according to above <1>, wherein the alkoxynaphthol-based polymerization inhibitor (g) and the thioether-based polymerization inhibitor (h) are represented by the following formula (1) and the following formula (2).

[Formula 1]

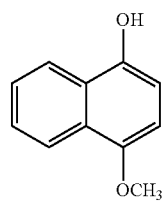

(1)

[Formula 2]

(2)

<3> The resin composition according to above <1> or <2>, wherein the aralkyl-based cyanate ester compound (b) is at least one selected from the group consisting of a naphthol aralkyl-based cyanate ester compound, a phenol aralkyl-based cyanate ester compound, a biphenyl aralkyl-based cyanate ester compound and a novolac aralkyl-based cyanate ester compound.

<4> The resin composition according to any one of above <1> to <3>, wherein the bisphenol-based cyanate ester compound (c) is at least one selected from the group consisting of a bisphenol A-based cyanate ester compound, a bisphenol E-based cyanate ester compound, a bisphenol F-based cyanate ester compound, a bisphenol B-based cyanate ester compound and a bisphenol C-based cyanate ester compound.

<5> The resin composition according to any one of above <1> to <4>, wherein the bifunctional phenylene ether oligomer (a) is a terminal vinyl compound of a bifunctional phenylene ether oligomer (a) having a polyphenylene ether skeleton represented by the following general formula (3)

[Formula 3]

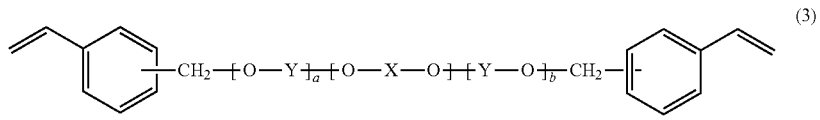

(3)

wherein —(O—X—O)— represents a structure represented by the following general formula (4) or the following general formula (5), —(Y—O)— represents a structure represented by the following general formula (6) and may be an arrangement of one structure or a random arrangement of two or more structures, and a and b each independently represent an integer of 0 to 100 provided that any one of a and b is not 0;

[Formula 4]

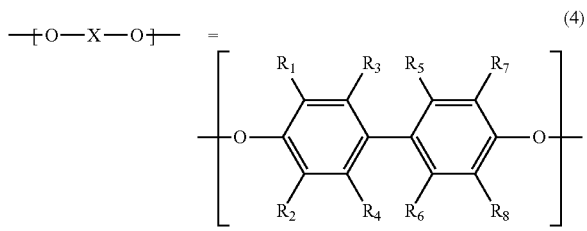

wherein $R_1$, $R_2$, $R_3$, $R_7$, and $R_8$ each independently represent a linear or branched alkyl group having 6 or less carbon atoms or a phenyl group and these may be the same or different, and $R_4$, $R_5$, and $R_6$ each independently represent a hydrogen atom, a linear or branched alkyl group having 6 or less carbon atoms or a phenyl group and these may be the same or different;

[Formula 5]

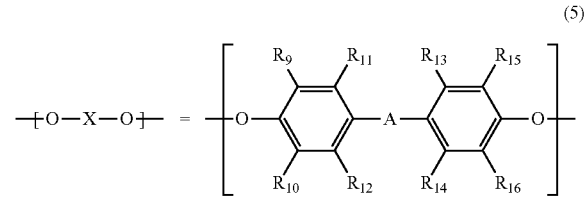

wherein $R_9$, $R_{10}$, $R_{11}$, $R_{12}$, $R_{13}$, $R_{14}$, $R_{15}$, and $R_{16}$ each independently represent a hydrogen atom, a linear or branched alkyl group having 6 or less carbon atoms or a phenyl group and these may be the same or different, and -A- represents a linear. branched or cyclic bivalent hydrocarbon group having 20 or less carbon atoms;

[Formula 6]

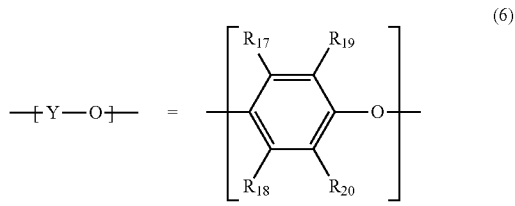

wherein $R_{17}$ and $R_{18}$ each independently represent a hydrogen atom, a linear or branched alkyl group having 6 or less carbon atoms or a phenyl group and these may be the same or different, and $R_{19}$ and $R_{20}$ each independently represent a linear or branched alkyl group having 6 or less carbon atoms or a phenyl group and these may be the same or different.

<6> The resin composition according to any one of above <1> to <5>, wherein the alkoxynaphthol-based polymerization inhibitor (g) is contained in an amount of 0.01 to 2 parts by mass based on 100 parts by mass of the total of the components (a) to (e).

<7> The resin composition according to any one of above <1> to <6>, wherein the thioether-based polymerization inhibitor (h) is contained in an amount of 0.01 to 2 parts by mass based on 100 parts by mass of the total of the components (a) to (e).

<8> The resin composition according to any one of above <1> to <7>, wherein the bifunctional phenylene ether oligomer (a) is contained in an amount of 65 to 75 parts by mass based on 100 parts by mass of the total of the components (a) to (e).

<9> The resin composition according to any one of above <1> to <8>, wherein the aralkyl-based cyanate ester compound (b) is contained in an amount of 3 to 10 parts by mass based on 100 parts by mass of the total of the components (a) to (e).

<10> The resin composition according to any one of above <1> to <9>, wherein the bisphenol-based cyanate ester compound (c) is contained in an amount of 3 to 10 parts by mass based on 100 parts by mass of the total of the components (a) to (e).

<11> The resin composition according to any one of above <1> to <10>, wherein the epoxy resin (d) is contained in an amount of 5 to 10 parts by mass based on 100 parts by mass of the total of the components (a) to (e).

<12> The resin composition according to any one of above <1> to <11>, wherein the epoxy resin (d) has an epoxy group, the aralkyl-based cyanate ester compound (b) and the bisphenol-based cyanate ester compound (c) have a cyanato group, and an equivalent ratio of the cyanato group in the aralkyl-based cyanate ester compound (b) and the bisphenol-based cyanate ester compound (c) to the epoxy group in the epoxy resin (d) is 1.8 to 8.0.

<13> The resin composition according to any one of above <1> to <12>, wherein the brominated carbonate oligomer (e) is contained in an amount of 10 to 15 parts by mass based on 100 parts by mass of the total of the components (a) to (e).
<14> The resin composition according to any one of above <1> to <13>, wherein the inorganic filler (f) is contained in an amount of 40 to 100 parts by mass based on 100 parts by mass of the total of the components (a) to (e).
<15> A prepreg obtained by impregnating or coating a substrate with the resin composition according to any one of above <1> to <14>.
<16> A metal foil-clad laminate obtained by stacking at least one sheet of the prepreg according to above <15>, and disposing metal foil on one or both surfaces of the resultant for lamination forming.
<17> A resin sheet obtained by coating a surface of a substrate with the resin composition according to any one of above <1> to <14> and drying the resultant, and then removing the substrate.
<18> A printed-wiring board comprising an insulating layer and a conductor layer formed on a surface of the insulating layer, wherein the insulating layer comprises the resin composition according to any one of above <1> to <14>.

Advantageous Effects of Invention

According to the present invention, a resin composition not only having excellent electrical characteristics and heat resistance after moisture absorption but also being excellent in flowing characteristics at the time of production of a laminate can be realized, and thus a prepreg, a metal foil-clad laminate and a resin sheet excellent in electrical characteristics, heat resistance after moisture absorption and formability are reproducibly realized in a simple manner. Furthermore, according to the present invention, since flowing characteristics at the time of production of a laminate are significantly improved, in particular, productivity of a high multilayer printed-wiring board is dramatically increased to thereby increase economic efficiency. Therefore, the present invention satisfies various demand performances in a printed-wiring board for high multilayer, or a printed-wiring board for high frequency and high multilayer for lead-free solder reflow, and can be suitably used, for example, for mother boards or for semiconductor plastic packages having semiconductor chips mounted thereon.

DESCRIPTION OF EMBODIMENTS

Hereinafter, an embodiment of the present invention will be described. It is to be noted that the following embodiment is illustrative for describing the present invention and the present invention is not limited only to the embodiment.

A resin composition of the present embodiment comprises a bifunctional phenylene ether oligomer (a) having a polyphenylene ether skeleton, an aralkyl-based cyanate ester compound (b), a bisphenol-based cyanate ester compound (c), an epoxy resin (d), a brominated carbonate oligomer (e), an inorganic filler (f), an alkoxynaphthol-based polymerization inhibitor (g) and/or a thioether-based polymerization inhibitor (h).

The bifunctional phenylene ether oligomer (a) for use in the present embodiment is a multimeric polymer (a multimer such as a dimer, a trimer, or a tetramer) of a bifunctional phenylene ether having a polyphenylene ether skeleton. As the bifunctional phenylene ether oligomer (a), those generally known can be used without particular limitation, but one represented by the following general formula (3) is suitably used.

[Formula 7]

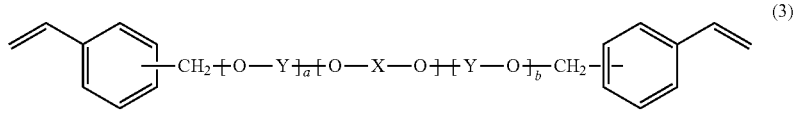

(3)

wherein —(O—X—O)— represents a structure represented by the following general formula (4) or the following general formula (5), —(Y—O)— represents a structure represented by the following general formula (6) and may be an arrangement of one structure or a random arrangement of two or more structures, and a and b each independently represent an integer of 0 to 100 provided that any one of a and b is not 0.

[Formula 8]

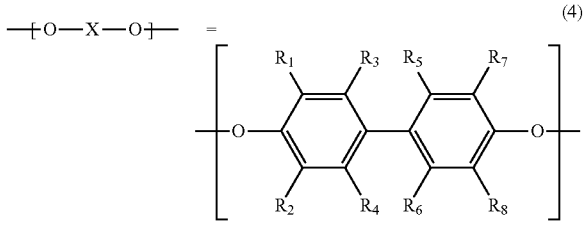

(4)

wherein $R_1$, $R_2$, $R_3$, $R_7$, and $R_8$ each independently represent a linear or branched alkyl group having 6 or less carbon atoms or a phenyl group and these may be the same or different, and $R_4$, $R_5$, and $R_6$ each independently represent a hydrogen atom, a linear or branched alkyl group having 6 or less carbon atoms or a phenyl group and these may be the same or different.

[Formula 9]

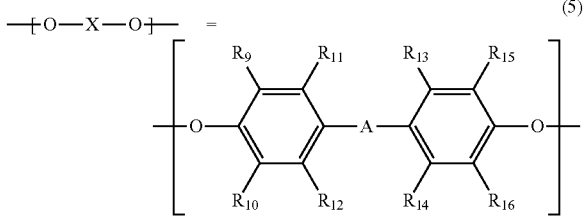

(5)

wherein $R_9$, $R_{10}$, $R_{11}$, $R_{12}$, $R_{13}$, $R_{14}$, $R_{15}$, and $R_{16}$ each independently represent a hydrogen atom, a linear or branched alkyl group having 6 or less carbon atoms or a phenyl group and these may be the same or different, and -A- represents a linear, branched or cyclic bivalent hydrocarbon group having 20 or less carbon atoms.

[Formula 10]

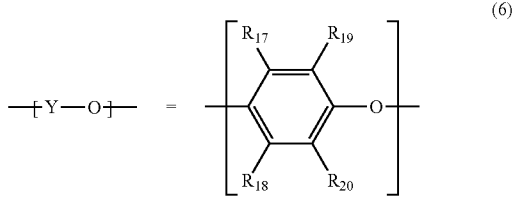

(6)

wherein $R_{17}$ and $R_{18}$ each independently represent a hydrogen atom, a linear or branched alkyl group having 6 or less carbon atoms or a phenyl group and these may be the same or different, and $R_{19}$ and $R_{20}$ each independently represent a linear or branched alkyl group having 6 or less carbon atoms or a phenyl group and these may be the same or different.

Examples of -A- in the general formula (5) include divalent hydrocarbon groups such as methylene, ethylidene, 1-methylethylidene, 1,1-propylidene, 1,4-phenylenebis(1-methylethylidene), 1,3-phenylenebis(1-methylethylidene), cyclohexylidene, phenylmethylene, naphthylmethylene and 1-phenylethylidene, but are not limited thereto.

As the bifunctional phenylene ether oligomer (a) represented by the above general formula (3), preferable is one wherein $R_1$, $R_2$, $R_3$, $R_7$, $R_8$, $R_{17}$, and $R_{18}$ are each a linear or branched alkyl group having 3 or less carbon atoms, and $R_4$, $R_5$, $R_6$, $R_9$, $R_{10}$, $R_{11}$, $R_{12}$, $R_{13}$, $R_{14}$, $R_{15}$, $R_{16}$, $R_{19}$, and $R_{20}$ are each a hydrogen atom or a linear or branched alkyl group having 3 or less carbon atoms. In particular, as the bifunctional phenylene ether oligomer (a) represented by the above general formula (3), more preferable is one wherein —(O—X—O)— represented by the general formula (4) or the general formula (5) is represented by the following formula (7), the following general formula (8) or the following general formula (9), and —(Y—O)— represented by the general formula (6) is represented by the following general formula (10) or the following general formula (11), or has a structure in which those represented by the formulae (10) and (11) are randomly arranged.

[Formula 11]

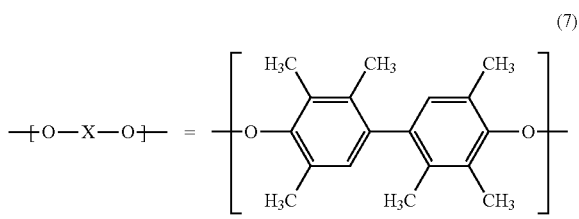

(7)

[Formula 12]

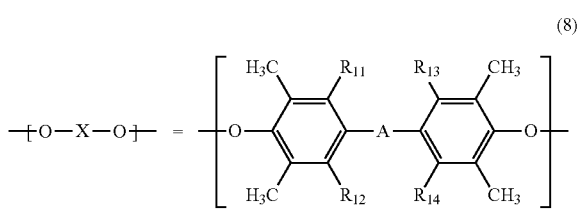

(8)

wherein $R_{11}$, $R_{12}$, $R_{13}$, and $R_{14}$ each independently represent a hydrogen atom or a methyl group and these may be the same or different, and -A- represents a linear, branched or cyclic bivalent hydrocarbon group having 20 or less carbon atoms and is defined as for -A- in the general formula (5).

[Formula 13]

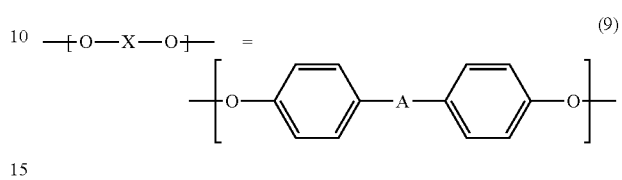

(9)

wherein -A- represents a linear, branched or cyclic bivalent hydrocarbon group having 20 or less carbon atoms and is defined as for -A- in the general formula (5).

[Formula 14]

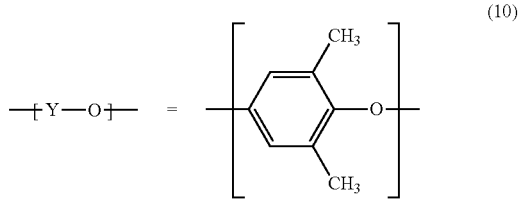

(10)

[Formula 15]

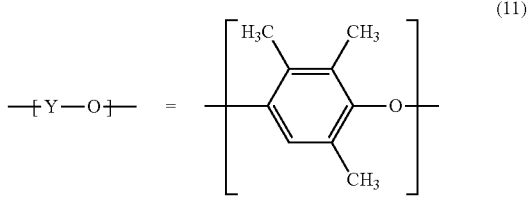

(11)

The bifunctional phenylene ether oligomer (a) represented by the above general formula (3) can be obtained by, for example, vinylbenzyl etherification of a terminal phenol hydroxyl group of the bifunctional phenylene ether oligomer. As the production method thereof, a known procedure can be applied without particular limitation. The bifunctional phenylene ether oligomer (a) can be produced by, for example, vinylbenzyl etherification of a terminal phenolic hydroxyl group of a bifunctional phenylene ether oligomer obtained by oxidative coupling of a bifunctional phenol compound and a monofunctional phenol compound.

More specifically, the bifunctional phenylene ether oligomer can be produced by, for example, dissolving the bifunctional phenol compound, the monofunctional phenol compound and a catalyst in a solvent, and then blowing oxygen thereinto under heating and stirring. Examples of the bifunctional phenol compound used here include 2,2',3,3', 5,5'-hexamethyl-(1,1'-biphenol)-4,4'-diol, 4,4'-methylenebis (2,6-dimethylphenol), 4,4'-dihydroxyphenylmethane, and 4,4'-dihydroxy-2,2'-diphenylpropane, but are not particularly limited thereto. In addition, examples of the monofunctional phenol include 2,6-dimethylphenol and 2,3,6-trimethylphenol, but are not particularly limited thereto. Furthermore, examples of the catalyst used here include combinations of copper salts such as CuCl, CuBr, CuI, $CuCl_2$ and $CuBr_2$ with amines such as di-n-butylamine, n-butyldimethylamine, N,N'-di-t-butylethylenediamine, pyridine, N,N,N',N'-tetramethylethylenediamine, pyridine, piperidine and imidazole, but are not particularly limited thereto. In addition, examples of the solvent used here include toluene, methanol, methyl ethyl ketone, and xylene, but are not particularly limited thereto.

The vinylbenzyl etherification of a terminal phenol hydroxyl group of the bifunctional phenylene ether oligomer can be performed by, for example, dissolving the bifunctional phenylene ether oligomer and a vinylbenzyl chloride in the solvent, adding a base thereto under heating and stirring for reaction, and then solidifying a resin. Examples of the vinylbenzyl chloride used here include o-vinylbenzyl chloride, m-vinylbenzyl chloride, p-vinylbenzyl chloride, and mixtures thereof, but are not particularly limited thereto. In addition, examples of the base include sodium hydroxide, potassium hydroxide, sodium methoxide, and sodium ethoxide, but are not particularly limited thereto. After the reaction, an acid can also be used in order to neutralize an excess base. Examples of the acid used here include hydrochloric acid, sulfuric acid, phosphoric acid, boric acid, and nitric acid, but are not particularly limited thereto. In addition, examples of the reaction solvent include toluene, xylene, acetone, methyl ethyl ketone, methyl isobutyl ketone, dimethylformamide, dimethylacetamide, methylene chloride, and chloroform, but are not particularly limited thereto. Herein, examples of the solidification method include a method of evaporating the solvent to dryness, and a method of mixing a reaction liquid with a poor solvent for reprecipitation, but are not particularly limited thereto.

The molecular weight of the bifunctional phenylene ether oligomer (a) is not particularly limited, but the number average molecular weight Mn in terms of polystyrene by the GPC method is preferably 500 to 3,000 from the viewpoints of handling property of a coating film to be formed and solubility in the solvent. When the molecular weight falls within this range, a coating film to be formed is not sticky and a good solubility in the solvent is also exhibited.

The content of the bifunctional phenylene ether oligomer (a) in the resin composition of the present embodiment can be appropriately set depending on the desired performance, and is not particularly limited. When this bifunctional phenylene ether oligomer (a) is the main component of the resin composition of the present embodiment, the effect of significantly improving flowing characteristics as described above tends to be relatively remarkably exerted. The main component used here means that the content of the bifunctional phenylene ether oligomer (a) is 50 parts by mass or more based on 100 parts by mass of the total of the components (a) to (e) in the resin composition, and the upper limit of the content is not particularly limited, but is 85 parts by mass or less. From the viewpoint of further improving electrical characteristics, the content of the bifunctional phenylene ether oligomer (a) is preferably 65 to 75 parts by mass, more preferably 66 to 72 parts by mass, and further preferably 67 to 70 parts by mass, based on 100 parts by mass of the total of the components (a) to (e) in the resin composition. Herein, the bifunctional phenylene ether oligomer (a) can be used singly or as a mixture of two or more.

The aralkyl-based cyanate ester compound (b) for use in the present embodiment is a cyanate ester compound having an aralkyl skeleton such as a naphthol aralkyl skeleton, a phenol aralkyl skeleton, a biphenyl aralkyl skeleton, and a novolac aralkyl skeleton. Specific examples thereof include a naphthol aralkyl-based cyanate ester compound, a phenol aralkyl-based cyanate ester compound, a biphenyl aralkyl-based cyanate ester compound, and a novolac aralkyl-based cyanate ester compound, but are not particularly limited thereto. Herein, the aralkyl-based cyanate ester compound (b) can be used singly or as a mixture of two or more. Among them, from the viewpoint of heat resistance after moisture absorption, a naphthol aralkyl-based cyanate ester compound and a biphenyl aralkyl-based cyanate ester compound are preferable, and a naphthol aralkyl-based cyanate ester compound is more preferable.

In particular, the aralkyl-based cyanate ester compound (b) for use in the present embodiment is particularly preferably a naphthol aralkyl-based cyanate ester compound represented by the following general formula (12), and a prepolymer thereof.

[Formula 16]

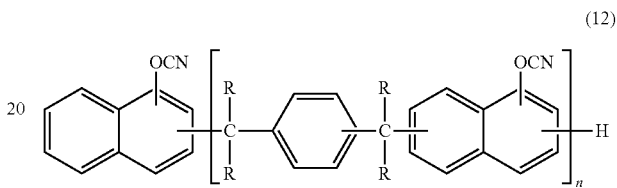

(12)

(wherein R(s) each independently represent a hydrogen atom or a methyl group and these may be the same or different, and n is a numerical number of 1 to 10 as an average value.)

The naphthol aralkyl-based cyanate ester compound represented by the above general formula (12) can be obtained by, for example, condensing with cyanic acid a naphthol aralkyl resin obtained from a reaction of a naphthol such as α-naphthol or β-naphthol with p-xylene glycol, α,α'-dimethoxy-p-xylene, or 1,4-di(2-hydroxy-2-propyl)benzene. As the method for producing the naphthol aralkyl-based cyanate ester compound (b) represented by the general formula (12), a known procedure can be applied without particular limitation. For example, the compound (b) can be produced by appropriately applying an existing method as cyanate ester synthesis. Specifically, the cyanate ester compound represented by the above general formula (12) or the prepolymer thereof can be obtained by allowing a naphthol aralkyl resin represented by the following general formula (13) and a cyanogen halide to react with each other in an inactive organic solvent in the presence of a basic compound. In addition, the cyanate ester compound represented by the above general formula (12) or the prepolymer thereof can also be obtained by forming a salt of the naphthol aralkyl resin and a basic compound in a solution containing water, followed by a two-phase interface reaction with a cyanogen halide.

[Formula 17]

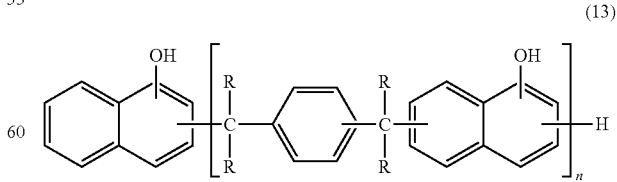

(13)

(wherein R(s) each independently represents a hydrogen atom or a methyl group and these may be the same or different, and n is a numerical number of 1 to 10 as an average value.)

The content of the aralkyl-based cyanate ester compound (b) in the resin composition of the present embodiment can be appropriately set depending on the desired performance, and is not particularly limited. From the viewpoint of further improving heat resistance after moisture absorption, the content of the aralkyl-based cyanate ester compound (b) is preferably 3 to 10 parts by mass, more preferably 3 to 8 parts by mass, and further preferably 4 to 7 parts by mass, based on 100 parts by mass of the total of the components (a) to (e) in the resin composition. Herein, the aralkyl-based cyanate ester compound (b) can be used singly or as a mixture of two or more.

The bisphenol-based cyanate ester compound (c) for use in the present embodiment is a cyanate ester compound having a bisphenol skeleton such as bisphenol A, bisphenol E, bisphenol F, bisphenol B, and bisphenol C. Specific examples thereof include a bisphenol A-based cyanate ester compound, a bisphenol E-based cyanate ester compound, a bisphenol F-based cyanate ester compound, a bisphenol B-based cyanate ester compound, and a bisphenol C-based cyanate ester compound, but are not particularly limited thereto. Herein, the bisphenol-based cyanate ester compound (c) can be used singly or as a mixture of two or more. Among them, from the viewpoint of flowing characteristics at the time of production of a laminate, a bisphenol A-based cyanate ester compound, a bisphenol E-based cyanate ester compound, and a bisphenol F-based cyanate ester compound are preferable, and a bisphenol A-based cyanate ester compound is more preferable.

The bisphenol-based cyanate ester compound (c) for use in the present embodiment is a cyanate ester obtained by cyanation of two phenolic hydroxyl groups in each bisphenol, and also includes one obtained by prepolymerization of such a cyanate ester. As an example, specific examples of the bisphenol A-based cyanate ester compound include 2,2-bis(4-cyanatephenyl)propane.

The content of the bisphenol-based cyanate ester compound (c) in the resin composition of the present embodiment can be appropriately set depending on the desired performance, and is not particularly limited. From the viewpoint of further improving heat resistance after moisture absorption, the content of the bisphenol-based cyanate ester compound (c) is preferably 3 to 10 parts by mass, more preferably 4 to 10 parts by mass, and further preferably 5 to 9 parts by mass, based on 100 parts by mass of the total of the components (a) to (e) in the resin composition.

Herein, it is at least necessary in the resin composition of the present embodiment that the aralkyl-based cyanate ester compound (b) and the bisphenol-based cyanate ester compound (c) be used at the same time as the cyanate ester compound. The ratio thereof contained can be appropriately set depending on the desired performance, and is not particularly limited, but the ratio, (b):(c), is preferably 1:5 to 3:1 and more preferably 1:3 to 2:1 from the viewpoint of simultaneously satisfying heat resistance after moisture absorption and flowing characteristics at the time of production of a laminate.

With respect to the epoxy resin (d) for use in the present embodiment, known one can be appropriately used as long as it has two or more epoxy groups in one molecule, and the kind thereof is not particularly limited. Specific examples include a bisphenol A-based epoxy resin, a bisphenol E-based epoxy resin, a bisphenol F-based epoxy resin, a bisphenol S-based epoxy resin, a bisphenol A novolac-based epoxy resin, a phenol novolac-based epoxy resin, a cresol novolac-based epoxy resin, a biphenyl-based epoxy resin, a naphthalene-based epoxy resin, an anthracene-based epoxy resin, a trifunctional phenol-based epoxy resin, a tetrafunctional phenol-based epoxy resin, a glycidyl ester-based epoxy resin, a phenol aralkyl-based epoxy resin, an aralkyl novolac-based epoxy resin, a biphenyl aralkyl-based epoxy resin, a naphthol aralkyl-based epoxy resin, a dicyclopentadiene-based epoxy resin, a polyol-based epoxy resin, an alicyclic epoxy resin, glycidyl amine, a compound obtained by epoxidation of a double bond in a glycidyl ester, butadiene, or the like, a compound obtained by reaction of a hydroxyl group-containing silicone resin with epichlorohydrin, or halides thereof (for example, a brominated bisphenol A-based epoxy resin, a brominated phenol novolac-based epoxy resin, and a brominated novolac-based epoxy resin), but are not particularly limited thereto. These can be used singly or as a mixture of two or more.

The content of the epoxy resin (d) in the resin composition of the present embodiment can be appropriately set depending on the desired performance, and is not particularly limited. From the viewpoint of further improving electrical characteristics and heat resistance after moisture absorption, the content of the epoxy resin (d) is preferably 5 to 10 parts by mass, more preferably 6 to 9 parts by mass, and further preferably 7 to 8 parts by mass, based on 100 parts by mass of the total of the components (a) to (e) in the resin composition.

In addition, from the viewpoint of further improving electrical characteristics and heat resistance after moisture absorption, the equivalent ratio of the cyanato group of the aralkyl-based cyanate ester compound (b) and the bisphenol-based cyanate ester compound (c) to the epoxy group of the epoxy resin (d) in the resin composition of the present embodiment is preferably 1.8 to 8.0, more preferably 1.83 to 6.0, and further preferably 1.86 to 5.5.

The brominated carbonate oligomer (e) for use in the present embodiment is a multimeric polymer (a multimer such as a dimer, a trimer, or a tetramer) of a bromine atom-containing carbonate, specific examples thereof include a carbonate oligomer of brominated bisphenol A and a carbonate oligomer of tetrabromobisphenol A, but are not particularly limited thereto, and known one can be appropriately used therefor. These can be used singly or as a mixture of two or more.

Herein, the molecular weight of the brominated carbonate oligomer (e) is not particularly limited, but the weight average molecular weight Mw is preferably 500 to 7,000 and more preferably 1,000 to 5,000 from the viewpoints of handleability of a coating film to be formed and solubility in the solvent.

The content of the brominated carbonate oligomer (e) in the resin composition of the present embodiment can be appropriately set depending on the desired performance, and is not particularly limited. From the viewpoint of further improving electrical characteristics and heat resistance after moisture absorption, the content of the brominated carbonate oligomer (e) is preferably 10 to 15 parts by mass, more preferably 11 to 14 parts by mass, and further preferably 12 to 13 parts by mass, based on 100 parts by mass of the total of the components (a) to (e) in the resin composition.

As the inorganic filler (f) for use in the present embodiment, generally known one can be used without particular limitation, but one for use in laminate applications can be suitably used. Specific examples include silicas such as natural silica, fused silica, synthetic silica, amorphous silica and hollow silica, molybdenum compounds such as molybdenum oxide and zinc molybdate, boehmite, white carbon, titanium white, aerosil, silicone composite powder, silicone resin powder, zinc borate, zinc stannate, alumina, clay, kaolin, talc, fired clay, fired kaolin, fired talc, natural mica, synthetic mica, zinc oxide, magnesium oxide, zirconium oxide, aluminum hydroxide, boron nitride, barium sulfate, E-glass, A-glass, NE-glass, C-glass, L-glass, D-glass, S-glass, M-glass G20, short glass fiber (including fine powders of glasses such as E glass, T glass, D glass, S glass, and Q glass.), hollow glass, and spherical glass. These can be used singly or in combination of two or more. Among them, from the viewpoint of the amount of expansion/contraction of the prepreg or the like to be obtained, silicas such as mesoporous silica, spherical fused silica, spherical synthetic silica, and hollow spherical silica are preferable.

Herein, the average particle size (D50) of the inorganic filler (f) is not particularly limited, but is preferably 0.1 to 3 μm in consideration of dispersibility, flowing characteristics at the time of production of a laminate, drill workability, and the like. The average particle size (D50) here means a value when the particle size distribution of a predetermined amount of a powder charged in an aqueous dispersion medium is measured by a laser diffraction particle size distribution analyzer and a cumulative volume from small particles reaches 50% of the entire volume.

The content of the inorganic filler (f) in the resin composition of the present embodiment can be appropriately set depending on the desired performance, and is not particularly limited. From the viewpoint of further improving electrical characteristics and heat resistance after moisture absorption, the content of the inorganic filler (f) is preferably 40 to 100 parts by mass, more preferably 45 to 80 parts by mass, and further preferably 50 to 60 parts by mass, based on 100 parts by mass of the total of the components (a) to (e) in the resin composition.

In the resin composition of the present embodiment, a silane coupling agent and a wetting and dispersing agent may be used together with the inorganic filler (f). The silane coupling agent is not particularly limited, but one generally used in a surface treatment of an inorganic material can be suitably used. Specific examples thereof include aminosilane-based ones such as γ-aminopropyltriethoxysilane and N-β-(aminoethyl)-γ-aminopropyltrimethoxysilane, epoxysilane-based ones such as γ-glycidoxypropyltrimethoxysilane, vinylsilane-based ones such as γ-methacryloxypropyltrimethoxysilane, cationic silane-based ones such as N-β-(N-vinylbenzylaminoethyl)-γ-aminopropyltrimethoxysilane hydrochloride, and phenylsilane-based ones. In addition, the wetting and dispersing agent is not particularly limited, but one generally used for paints can be suitably used. Specific examples thereof include polymeric wetting and dispersing agents having an acid group. These silane coupling agents and wetting and dispersing agents can be used singly or as a mixture of two or more.

The polymerization inhibitor for use in the present embodiment is the alkoxynaphthol-based polymerization inhibitor (g) and/or the thioether-based polymerization inhibitor (h). Such a polymerization inhibitor is used together with the components (a) to (e) to thereby not only enable a prepreg excellent in electrical characteristics and heat resistance after moisture absorption to be realized, but also further remarkably enhance flowing characteristics at the time of production of a laminate.

Specific examples of the alkoxynaphthol-based polymerization inhibitor (g) include 4-methoxy-1-naphthol, 4-ethoxy-1-naphthol, and 4-benzyloxy-1-naphthol, but are not particularly limited thereto. In addition, specific examples of the thioether-based polymerization inhibitor (h) include dilauryl 3,3'-thiodipropionate, ditridecyl-3,3'-thiodipropionate, dimyristyl 3,3'-thiodipropionate, distearyl 3,3'-thiodipropionate, distearyl-3,3'-methyl-3,3'-thiodipropionate, tetrakis-methylene-3-(laurylthio)propionate methane, laurylstearyl-3,3'-thiodipropionate, β-laurylthiopropionate, tetrakismethylene-3-(laurylthio)propionate methane, pentaerythrityl-tetrakis(3-laurylthiopropionate), and pentaerythrityltetrakis(3-dodecylthiopropionate, but are not particularly limited thereto. These can be produced by a known method, and are easily available as commercial products. In addition, such polymerization inhibitors (g) and (h) can be used singly or as a mixture of two or more.

Among them, the alkoxynaphthol-based polymerization inhibitor (g) and/or thioether-based polymerization inhibitor (h) are/is preferably 4-methoxy-1-naphthol represented by the following formula (1) and pentaerythrityl-tetrakis(3-laurylthiopropionate) represented by the following formula (2), and more preferably pentaerythrityl-tetrakis(3-laurylthiopropionate) represented by the following formula (2), from the viewpoints of preventing flowing characteristics at the time of production of a laminate, curing behavior and electrical characteristics, and heat resistance after moisture absorption from being deteriorated and the like.

[Formula 18]

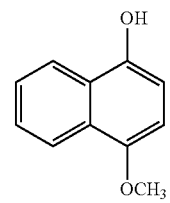

(1)

[Formula 19]

(2)

A commercial product of the alkoxynaphthol-based polymerization inhibitor (g) represented by the above formula (1) is, for example, Quino Power MNT produced by Kawasaki Kasei Chemicals. In addition, a commercial product of the thioether-based polymerization inhibitor (h) represented by the above formula (2) is, for example, Sumilizer TP-D produced by Sumitomo Chemical Co., Ltd.

The content of each of the polymerization inhibitors (g) and (h) in the resin composition of the present embodiment can be appropriately set depending on the desired performance, and is not particularly limited. From the viewpoint of flowing characteristics at the time of production of a laminate and curing behavior, the content of each of these polymerization inhibitors (g) and (f) is preferably 0.01 to 2 parts by mass, more preferably 0.03 to 1 part by mass, and further preferably 0.05 to 0.3 parts by mass, based on 100 parts by mass of the total of the components (a) to (e) in the resin composition.

The resin composition of the present embodiment may contain a curing accelerator for appropriately regulating a curing speed as long as the desired purpose is not impaired. Such a curing accelerator is known in the art, and for example, one generally used as a curing accelerator for the bifunctional phenylene ether oligomer (a), the aralkyl-based cyanate ester compound (b), the bisphenol-based cyanate ester compound (c), or the epoxy resin (d) can be suitably used. Specific examples of the curing accelerator include organic metal salts of copper, zinc, cobalt, nickel, and the like, imidazoles and derivatives thereof, tertiary amines, and a radical polymerization initiator, but are not particularly limited thereto. The curing accelerator can be used singly or in combination of two or more.

The resin composition of the present embodiment may contain a crosslinking curing agent as long as the desired purpose is not impaired. The crosslinking curing agent is contained to thereby improve fluidity of the resin composition and enhance peeling strength of copper foil. As the crosslinking curing agent, one known in the art can be appropriately used without particular limitation, but one compatible with the bifunctional phenylene ether oligomer (a) is preferably used. Specific examples include multifunctional vinyl compounds such as divinylbenzene, divinylnaphthalene and divinylbiphenyl, a vinylbenzyl ether compound synthesized by a reaction of phenol with vinylbenzyl chloride, a styrene monomer, an allyl ether compound synthesized by a reaction of phenol with allyl chloride, and trialkenyl isocyanurate. Among them, from the viewpoint of enhancing formability and peeling strength of copper foil, trialkenyl isocyanurate, more specifically, triallyl isocyanurate (TAIC) and triallyl cyanurate (TAC) that are particularly good compatibility are preferable.

Furthermore, the resin composition of the present embodiment may contain other components than the above components as long as the desired purpose is not impaired. Examples of such optional blending materials include various high molecular compounds such as a thermosetting resin, a thermoplastic resin, and oligomers and elastomers thereof other than those described above, a flame retardant compound, and various additives. These are not particularly limited as long as these are commonly used in the art. Specific examples of the flame retardant compound include bromine compounds such as 4,4'-dibromobiphenyl, phosphate, melamine phosphate, a phosphorus-containing epoxy resin, nitrogen compounds such as melamine and benzoguanamine, an oxazine ring-containing compound, and a silicon compound. The additives include an ultraviolet absorber, an antioxidant, a photopolymerization initiator, a fluorescent whitener, a photosensitizer, a dye, a pigment, a thickener, a lubricant, an antifoamer, a dispersant, a leveling agent, and a gloss agent. Such optional blending materials can be used singly or in combination of two or more.

In addition, the resin composition of the present embodiment may further contain an organic solvent, if necessary. That is, the resin composition of the present embodiment can be used as a mode (varnish) in which each of the above components is at least partially, preferably entirely, dissolved in or compatible with the organic solvent. When the organic solvent is used in this way, for example, the viscosity of the resin composition at the time of preparation is lowered, resulting in the enhancement in handleability and the improvement in impregnating properties in a glass cloth. This organic solvent is not particularly limited as long as the mixture of the above components can be at least partially, preferably entirely, dissolved therein or compatible therewith. Specific examples thereof include ketones such as acetone, methyl ethyl ketone and methyl isobutyl ketone; polar solvents such as dimethylacetamide and dimethylformamide; and aromatic hydrocarbon solvents such as toluene and xylene, but are not particularly limited thereto. The organic solvent can be used singly or in combination of two or more.

Herein, the resin composition of the present embodiment may contain other polymerization inhibitor than the alkoxynaphthol-based polymerization inhibitor (g) and the thioether-based polymerization inhibitor (h) described above in order to, for example, increase preservation stability in the varnish state in which the resin composition is dissolved in the organic solvent, as long as the desired characteristics are not impaired. As other polymerization inhibitor, those generally known can be used without particular limitation, but examples include t-butylcatechol and di-t-butylhydroxytoluene. However, the resin composition of the present embodiment preferably contains substantially no polymerization inhibitor other than the alkoxynaphthol-based polymerization inhibitor (g) and the thioether-based polymerization inhibitor (h) described above from the viewpoint of simultaneously satisfying electrical characteristics, heat resistance after moisture absorption and flowing characteristics at the time of production of a laminate at a high level. Herein, "contains substantially no" means that the content of other polymerization inhibitor in the resin composition of the present embodiment is 1% by mass or less, preferably 0.5% by mass, further preferably 0.1% by mass, and particularly preferably 0.05% by mass or less.

The resin composition of the present embodiment can be prepared according to a conventional method, and the preparation method is not particularly limited. For example, the resin composition of the present embodiment can be easily prepared by sequentially blending each of the above components with the organic solvent and sufficiently stirring and mixing the resultant. Herein, when the resin composition is prepared, a known treatment (stirring, mixing and kneading treatment or the like) for uniformly dissolving or dispersing the above respective components can be performed. The stirring, mixing and kneading treatment can be appropriately performed by using, for example, an apparatus for mixing, such as a ball mill and a bead mill, or a known apparatus such as a planetary centrifugal mixing apparatus.

On the other hand, a prepreg of the present embodiment can be obtained by combining the resin composition with a substrate, specifically, impregnating or coating a substrate with the resin composition. The method for producing the prepreg can be performed according to a conventional method, and is not particularly limited. For example, a substrate can be impregnated or coated with the resin composition, and then, for example, dried at 130 to 180° C. for about 3 to 20 minutes for semi-curing (B-staging) to produce the prepreg of the present embodiment. Here, the amount of the resin composition (including the inorganic filler (f) and other inorganic filler.) to the total amount of the prepreg is preferably in a range from 30 to 90% by mass.

The substrate for use in the prepreg of the present embodiment is not particularly limited, and known one used for various printed-wiring board materials can be appropriately selected depending on the intended use and performance, and used. Specific examples thereof include glass fibers of E glass, D glass, S glass, T glass, Q glass, spherical glass and NE glass, or the like, inorganic fibers other than glass, such as quartz, organic fibers such as polyimide, polyamide and polyester, and woven fabrics such as liquid crystal polyester. The substrate can be appropriately selected depending on the intended use and performance, and used. The substrate can be used singly or in combination of two or more. As the form of the substrate, a woven fabric, a non-woven fabric, a roving, a chopped strand mat, a surfacing mat, and the like are known, as the weave of the woven fabric, plain weave, mat weave, twill weave, and the like are known, and the form and the weave can be appropriately selected from these known ones depending on the intended use and performance, and used. In addition, the thickness of the substrate is not particularly limited, but is suitably in a range from 0.01 to 0.2 mm in the case of, for example, laminate applications. In particular, in laminate applications, a woven fabric subjected to a super opening treatment or a clogging treatment and having a thickness of 0.01 to 0.2 mm is particularly suitable in view of dimensional stability. In addition, a glass woven fabric subjected to a surface treatment with a silane coupling agent, such as an epoxysilane treatment and an aminosilane treatment is suitably used from the viewpoint of heat resistance after moisture absorption. In addition, a liquid crystal polyester woven fabric is also suitably used from the viewpoint of electrical characteristics.

On the other hand, a metal foil-clad laminate of the present embodiment is one obtained by using the prepreg for lamination forming. Specifically, the metal foil-clad laminate of the present embodiment can be produced by stacking at least one sheet of the prepreg, and disposing metal foil such as copper or aluminum foil on one or both surfaces of the resultant for lamination forming, for example, at a temperature of 180 to 220° C. and at a surface pressure of 20 to 40 kg/cm$^2$ for a heating time of 100 to 300 minutes. The metal foil for use here is not particularly limited as long as it is used in laminate applications, but copper foil such as rolled copper foil or electrolytic copper foil is preferable. In consideration of a conductor loss in a high frequency region, electrolytic copper foil having small mat surface roughness is more suitable. In addition, the thickness of the metal foil is not particularly limited, but is preferably 2 to 70 μm and more preferably 2 to 35 μm. Herein, as the method for producing the metal foil-clad laminate, a general procedure for laminates can be appropriately applied and is not particularly limited. For example, when the metal foil-clad laminate is formed, a multistage pressing machine, a multistage vacuum pressing machine, a continuous forming machine, an autoclave forming machine, or the like can be used. In addition, as a method for producing a multi-layer plate, a general procedure for multi-layer plates can be appropriately applied and is not particularly limited. For example, 35 μm copper foil is disposed on both surfaces of one sheet of the prepreg, the resultant is subjected to lamination forming under the above conditions, and then an inner layer circuit is formed and the circuit is subjected to a blackening treatment to form an inner layer circuit board. Thereafter, this inner layer circuit board and the prepreg are alternately disposed one by one, the copper foil is disposed on the outermost layer, and the resultant is subjected to lamination forming under the above conditions preferably in vacuum to thereby provide a multi-layer plate.

In addition, a resin sheet of the present embodiment can be obtained by coating a substrate with the resin composition and drying the resultant, and then removing the substrate. The substrate for use here is not particularly limited, and known one can be used as long as it can support a coating film (resin layer) of the resin composition. Specific examples thereof include organic film substrates such as a polyethylene film, a polypropylene film, a polycarbonate film, a polyethylene terephthalate) film, an ethylene tetrafluoroethylene copolymer film, a polyimide film, and a release film obtained by coating the surface of each of these films with a release agent, conductor foils such as copper foil and aluminum foil, and plate-shaped substrates such as a glass plate, a SUS plate and FRP.

The method for producing the resin sheet is not particularly limited and a general method for forming a sheet can be appropriately applied. Examples include a method in which the substrate is coated with the resin composition by using a bar coater, a die coater, a doctor blade, a baker applicator, or the like, and then the organic solvent is dried. When the organic solvent is dried, the drying is usually preferably performed at a temperature of 20° C. to 150° C. for 1 to 90 minutes because a lower temperature allows the solvent to easily remain in the resin composition and a higher temperature allows curing of the resin composition to progress. Herein, the thickness of the resin layer can be appropriately set depending on the desired performance, and is not particularly limited. In general, since a larger thickness of a coat allows the solvent to easily remain during drying, the thickness is preferably 0.1 to 500 μm. This thickness of the resin layer can be adjusted depending on, for example, the solid content concentration of the resin composition and the coating amount thereof. Then, after drying, the substrate can be removed to provide the resin sheet of the present embodiment. Herein, the removal of the substrate may be performed according to a conventional method, namely, a known procedure such as peeling or etching, and the removal method thereof is not particularly limited.

EXAMPLES

Hereinafter, the present invention will be described with reference to Examples and Comparative Examples in detail, but the present invention is not limited to these Examples at all. Hereinafter, "part(s)" represents "part(s) by mass" unless otherwise indicated.

Synthesis Example 1

Synthesis of Terminal Vinyl Compound of Bifunctional Phenylene Ether Oligomer Having Polyphenylene Ether Skeleton To a 12 L vertical reactor equipped with a stirring apparatus, a thermometer, an air-introducing tube and a baffle plate were charged 23.88 g (17.4 mmol) of CuBr, 0.75 g (4.4 mmol) of N,N'-di-t-butylethylenediamine, 28.04 g (277.6 mmol) of n-butyldimethylamine and 2,600 g of toluene, and stirred at a reaction temperature of 40° C. Then, while a mixed gas in which nitrogen and air were mixed so that the oxygen concentration was adjusted to 8% being bubbled at a flow rate of 5.2 L/min, a mixed solution of 129.3 g (0.48 mol) of 2,2',3,3',5,5'-hexamethyl-(1,1'-biphenol)-4,4'-diol, 233.7 g (1.92 mol) of 2,6-dimethylphenol, 64.9 g (0.48 mol) of 2,3,6-trimethylphenol, 0.51 g (2.9 mmol) of N,N'-di-t-butylethylenediamine and 10.90 g (108.0 mmol) of n-butyldimethylamine dissolved in 2,300 g of methanol in advance was dropped into this reactor over 230 minutes, and stirred. After the completion of dropping, 1,500 g of water in which 19.89 g (52.3 mmol) of tetrasodium ethylenediaminetetraacetate was dissolved was added thereto to quench the reaction. Thereafter, the aqueous layer and the organic layer were separated from each other, and the organic layer was washed with an aqueous 1 N hydrochloric acid solution and then washed with pure water. The resulting solution was concentrated by evaporator so as to have a concentration of 50% by weight, providing 836.5 g of a solution of a bifunctional phenylene ether oligomer (hereinafter, simply referred to as "resin A".) in toluene. With respect to the resulting resin A, the number average molecular weight was 986, the weight average molecular weight was 1,530, and the hydroxyl group equivalent was 471.

Then, to a reactor equipped with a stirring apparatus, a thermometer and a reflux tube were charged 836.5 g of the solution of resin A in toluene, 162.6 g of vinylbenzyl chloride (product name: CMS-P; produced by AGC Seimi Chemical Co. Ltd.), 1600 g of methylene chloride, 12.95 g of benzyldimethylamine, 420 g of pure water and 178.0 g of an aqueous 30.5% by weight NaOH solution, and stirred at a reaction temperature of 40° C. After the stirring for 24 hours, the organic layer was washed with an aqueous 1 N hydrochloric acid solution, and then washed with pure water. The resulting solution was concentrated by evaporator and dropped into methanol for solidification, and the solid was recovered by filtration and dried in vacuum to provide 503.5 g of a terminal vinyl compound of a bifunctional phenylene ether oligomer. With respect to the resulting terminal vinyl compound of a bifunctional phenylene ether oligomer, the number average molecular weight was 1187, the weight average molecular weight was 1675, and the vinyl group equivalent was 590 g/vinyl group.

Synthesis Example 2

Synthesis of α-Naphthol Aralkyl-Based Cyanate Ester Compound

A reactor equipped with a thermometer, a stirrer, a dropping funnel and a reflux condenser was cooled to 0 to 5° C. by brine in advance, and 7.47 g (0.122 mol) of cyanogen chloride, 9.75 g (0.0935 mol) of 35% hydrochloric acid, 76 ml of water and 44 ml of methylene chloride were charged thereto.

While the temperature and pH in this reactor being kept at −5 to +5° C. and 1 or less, a solution in which 20 g (0.0935 mol) of an α-naphthol aralkyl resin wherein all R(s) in the general formula (13) were a hydrogen atom (SN485, OH group equivalent: 214 g/eq., softening point: 86° C., produced by Nippon Steel Chemical Co., Ltd.) and 14.16 g (0.14 mol) of triethylamine were dissolved in 92 ml of methylene chloride was dropped through the dropping funnel into the reactor over 1 hour under stirring. After the completion of dropping, 4.72 g (0.047 mol) of triethylamine was further dropped into the reactor over 15 minutes.

After the completion of dropping, the resultant was stirred at the same temperature for 15 minutes and the reaction liquid was then subjected to separation to separate the organic layer. The resulting organic layer was washed with 100 ml of water twice, and thereafter methylene chloride was distilled off by evaporator under reduced pressure and finally concentrated to dryness at 80° C. for 1 hour, thereby providing 23.5 g of a cyanate ester compound of an α-naphthol aralkyl resin (α-naphthol aralkyl-based cyanate ester compound represented by the general formula (12)).

Example 1

Sixty-eight parts by mass of the terminal vinyl compound of a bifunctional phenylene ether oligomer obtained in Synthesis Example 1, 4 parts by mass of the α-naphthol aralkyl-based cyanate ester compound represented by the general formula (12) obtained in Synthesis Example 2, 9 parts by mass of a bisphenol A-based cyanate ester compound (CA210 produced by Mitsubishi Gas Chemical Company, Inc.), 4 parts by mass of a brominated bisphenol A-based epoxy resin (EPICLON 1123P produced by Dic Corporation), 3 parts by mass of a brominated novolac-based epoxy resin (BREN-S produced by Nippon Kayaku Co., Ltd.), 12 parts by mass of a brominated carbonate oligomer (FG8500 produced by Teijin Chemicals Ltd.), 50 parts by mass of spherical silica (SC2050, average particle size: 0.5 μm, produced by Admatechs) and 0.2 parts by mass of 4-methoxy-1-naphthol (Quino Power MNT produced by Kawasaki Kasei Chemicals) were blended with methyl ethyl ketone to prepare a resin composition (varnish) having a solid content concentration of 65% by weight.

Then, E glass cloth having a thickness of 0.08 mm (manufactured by Nitto Boseki Co., Ltd., #3313) was impregnation-coated with the resulting varnish, and the resultant was heated and dried at 175° C. for 5 minutes to thereby produce a prepreg having an amount of the resin composition of 55% by mass.

Furthermore, 8 sheets of the resulting prepreg were stacked, 18 μm copper foil (3EC-III produced by Mitsui Mining & Smelting Co., Ltd.) was disposed on both surfaces of the resulting laminated body, and the resultant was pressed in vacuum at a surface pressure of 30 kg/cm² and at 210° C. for 150 minutes to produce an 18-μm-copper-foil-attached laminate (copper-clad laminate) having a thickness of 0.8 mm.

The minimum melt viscosity of the resulting prepreg and the values of physical properties of the resulting copper-clad laminate are shown in Table 1.
Measurement Methods of Various Physical Properties
(1) Minimum Melt Viscosity of Prepreg As a sample, 1 g of a resin powder collected from the prepreg was used, and the minimum melt viscosity was measured by rheometer (ARES-G2 manufactured by TA Instruments). Herein, a disposable plate having a plate diameter of 25 mm was used, and the minimum melt viscosity of the resin was measured in a range from 40° C. to 210° C. under conditions of a rate of temperature rise of 2° C./min, a frequency of 10.0 rad/sec and a strain of 0.1%.
(2) Dielectric Constant of Laminate A test piece (n=1) in which the copper foil of the copper-clad laminate was removed was used to measure the dielectric tangent at 10 GHz by a cavity resonator perturbation method (Agilent 8722ES manufactured by Agilent Technologies).
(3) Dielectric Tangent of Laminate A test piece (n=1) in which the copper foil of the copper-clad laminate was removed was used to measure the dielectric tangent at 10 GHz by a cavity resonator perturbation method (Agilent 8722ES manufactured by Agilent Technologies).
(4) Heat Resistance after Moisture Absorption of Laminate A sample measuring 5 cm×5 cm (n=3) in which the copper foil of the 18-μm-copper-foil-attached laminate having a thickness of about 0.8 mm was etched was used to perform the following procedure. The sample was first dried at 115° C. for 20 hours, then treated by a pressure cooker tester (PC-3 Model manufactured by Hirayama Manufacturing Corp.) at 121° C. and at 2 atm for 3 hours, then immersed in a solder bath at 260° C. for 30 seconds, and then visually observed for the presence or absence of swelling. The evaluation criteria were defined as follows: no defect: (○: Good), and occurrence of swelling: (X: Poor).

Example 2

The same manner as in Example 1 was performed except that 0.2 parts by mass of Pentaerythrityl tetrakis(3-laurylthiopropionate) (Sumilizer TP-D produced by Sumitomo Chemical Co., Ltd.) was used instead of 4-methoxy-1-naphthol as the polymerization inhibitor.

The minimum melt viscosity of the resulting prepreg and the values of physical properties of the resulting copper-clad laminate are shown in Table 1.

Example 3

Sixty-six parts by mass of the terminal vinyl compound of a bifunctional phenylene ether oligomer obtained in Synthesis Example 1, 7 parts by mass of the α-naphthol aralkyl-based cyanate ester compound represented by the general formula (12) obtained in Synthesis Example 2, 7 parts by mass of the bisphenol A-based cyanate ester compound (CA210) used in Example 1, 3 parts by mass of a brominated bisphenol A-based epoxy resin (EPICLON 153 produced by Dic Corporation), 5 parts by mass of a cresol novolac-based epoxy resin (EPICLON N-680 produced by Dic Corporation), 12 parts by mass of the brominated carbonate oligomer (FG8500) used in Example 1, 50 parts by mass of spherical silica (SC2050) and 0.2 parts by mass of 4-methoxy-1-naphthol (Quino Power MNT) were blended with methyl ethyl ketone to prepare a resin composition (varnish) having a solid content concentration of 65% by weight.

The same manner as in Example 1 was performed except that this varnish was used, to thereby produce a prepreg having an amount of the resin composition of 55% by mass and an 18-μm-copper-foil-attached laminate (copper-clad laminate) having a thickness of 0.8 mm.

The minimum melt viscosity of the resulting prepreg and the values of physical properties of the resulting copper-clad laminate are shown in Table 1.

Example 4

The same manner as in Example 3 was performed except that 0.2 parts by mass of Pentaerythrityl tetrakis(3-laurylthiopropionate) (Sumilizer TP-D produced by Sumitomo Chemical Co., Ltd.) was used instead of 4-methoxy-1-naphthol as the polymerization inhibitor.

The minimum melt viscosity of the resulting prepreg and the values of physical properties of the resulting copper-clad laminate are shown in Table 1.

Example 5

The same manner as in Example 1 was performed except that 2 parts by mass of a bisphenol A-based epoxy resin (EPICLON 1051 produced by Dic Corporation) and 5 parts by mass of the cresol novolac-based epoxy resin (EPICLON N-680) used in Example 3 were used instead of the brominated bisphenol A-based epoxy resin (EPICLON 1123P) and the brominated novolac-based epoxy resin (BREN-S), and the amounts of the terminal vinyl compound of a bifunctional phenylene ether oligomer obtained in Synthesis Example 1 and the bisphenol A-based cyanate ester compound (CA210) blended were changed to 72 parts by mass and 5 parts by mass, respectively, to thereby produce a prepreg having an amount of the resin composition of 55% by mass and an 18-μm-copper-foil-attached laminate (copper-clad laminate) having a thickness of 0.8 mm.

The minimum melt viscosity of the resulting prepreg and the values of physical properties of the resulting copper-clad laminate are shown in Table 1.

Example 6

The same manner as in Example 5 was performed except that 0.2 parts by mass of Pentaerythrityl tetrakis(3-laurylthiopropionate) (Sumilizer TP-D) was used instead of 4-methoxy-1-naphthol as the polymerization inhibitor.

The minimum melt viscosity of the resulting prepreg and the values of physical properties of the resulting copper-clad laminate are shown in Table 1.

Comparative Example 1

The same manner as in Example 1 was performed except that blending of the polymerization inhibitor was omitted.

The minimum melt viscosity of the resulting prepreg and the values of physical properties of the resulting copper-clad laminate are shown in Table 2.

Comparative Example 2

The same manner as in Example 3 was performed except that blending of the polymerization inhibitor was omitted.

The minimum melt viscosity of the resulting prepreg and the values of physical properties of the resulting copper-clad laminate are shown in Table 2.

Comparative Example 3

The same manner as in Example 5 was performed except that blending of the polymerization inhibitor was omitted.

The minimum melt viscosity of the resulting prepreg and the values of physical properties of the resulting copper-clad laminate are shown in Table 2.

TABLE 1

|  | Example 1 | Example 2 | Example 3 | Example 4 | Example 5 | Example 6 |
|---|---|---|---|---|---|---|
| Minimum melt viscosity by rheometer (poise) | 3800 | 3500 | 4200 | 4200 | 6800 | 6000 |
| Dielectric constant (10 GHz) | 3.69 | 3.69 | 3.69 | 3.69 | 3.69 | 3.69 |
| Dielectric tangent (10 GHz) | 0.0054 | 0.0054 | 0.0058 | 0.0058 | 0.006 | 0.006 |
| Heat resistance after moisture absorption, PCT 3 hours, immersing at 260° C. for 30 seconds | ○○○ | ○○○ | ○○○ | ○○○ | ○○○ | ○○○ |

TABLE 2

|  | Comparative Example 1 | Comparative Example 2 | Comparative Example 3 |
|---|---|---|---|
| Minimum melt viscosity by rheometer (poise) | 10000 | 12000 | 22000 |
| Dielectric constant (10 GHz) | 3.69 | 3.69 | 3.69 |
| Dielectric tangent (10 GHz) | 0.0054 | 0.0058 | 0.006 |
| Heat resistance after moisture absorption, PCT 3 hours, immersing at 260° C. for 30 seconds | ○○○ | ○○○ | ○○○ |

It has been revealed from Table 1 and Table 2 that the alkoxynaphthol-based polymerization inhibitor (g) or the thioether-based polymerization inhibitor (h) is used together with the components (a) to (e) to thereby lower melt viscosity of the prepreg while electrical characteristics and heat resistance after moisture absorption of a printed-wiring board are kept excellent.

It is to be noted that the present application claims the priority based on Japanese Patent Application (Japanese Patent Application No. 2011-216480) filed with JPO on Sep. 30, 2011 and the content thereof is herein incorporated by reference.

INDUSTRIAL APPLICABILITY

As described above, since the resin composition, the prepreg and the like of the present invention have excellent electrical characteristics and heat resistance after moisture absorption, and are also excellent in flowing characteristics (formability) at the time of production of a laminate, they can be widely and effectively utilized in various applications in which such performances are demanded, such as an electrical insulating material, a semiconductor plastic package, a sealing material, an adhesive, a lamination material, a resist and a build-up laminate material, and can be particularly effectively utilized as, in particular, a printed-wiring board for high multilayer, or a printed-wiring board for high frequency and high multilayer for lead-free solder reflow and the like.

The invention claimed is:

1. A resin composition comprising
    a bifunctional phenylene ether oligomer (a) having a polyphenylene ether skeleton,
    an aralkyl-based cyanate ester compound (b),
    a bisphenol-based cyanate ester compound (c),
    an epoxy resin (d),
    a brominated carbonate oligomer (e),
    an inorganic filler (f), and
    a thioether-based polymerization inhibitor (h) selected from:
        tetrakis-methylene-3-(laurylthio)propionate methane,
        β-laurylthiopropionate, tetrakismethylene-3-(laurylthio)propionate methane,
        pentaerythrityl-tetrakis(3-laurylthiopropionate), and
        pentaerythrityl-tetrakis(3-dodecylthiopropionate).

2. The resin composition according to claim 1, wherein the thioether-based polymerization inhibitor (h) is represented by the following formula (2):

$$(H_{25}C_{12}SCH_2CH_2COOCH_2)_4C \qquad (2).$$

3. The resin composition according to claim 1, wherein the aralkyl-based cyanate ester compound (b) is at least one selected from the group consisting of a naphthol aralkyl-based cyanate ester compound, a phenol aralkyl-based cyanate ester compound, a biphenyl aralkyl-based cyanate ester compound and a novolac aralkyl-based cyanate ester compound.

4. The resin composition according to claim 1, wherein the bisphenol-based cyanate ester compound (c) is at least one selected from the group consisting of a bisphenol A-based cyanate ester compound, a bisphenol E-based cyanate ester compound, a bisphenol F-based cyanate ester compound, a bisphenol B-based cyanate ester compound and a bisphenol C-based cyanate ester compound.

5. The resin composition according to claim 1, wherein the bifunctional phenylene ether oligomer (a) is a terminal vinyl compound of a bifunctional phenylene ether oligomer (a) having a polyphenylene ether skeleton represented by the following general formula (3)

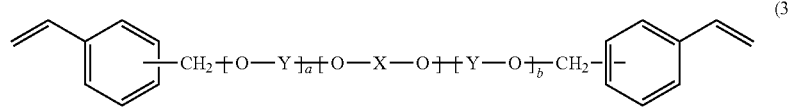

wherein —(O—X—O)— represents a structure represented by the following general formula (4) or the following general formula (5), —(Y—O)— represents a structure represented by the following general formula (6) and may be an arrangement of one structure or a random arrangement of two or more structures, and a and b each independently represent an integer of 0 to 100 provided that any one of a and b is not 0;

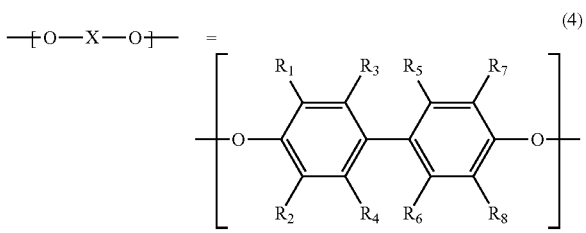

wherein $R_1$, $R_2$, $R_3$, $R_7$, and $R_8$ each independently represent a linear or branched alkyl group having 6 or less carbon atoms or a phenyl group and these may be the same or different, and $R_4$, $R_5$, and $R_6$ each independently represent a hydrogen atom, a linear or branched alkyl group having 6 or less carbon atoms or a phenyl group and these may be the same or different;

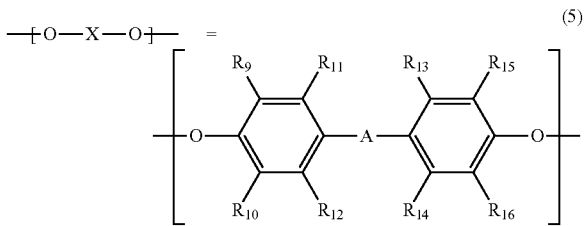

wherein $R_9$, $R_{10}$, $R_{11}$, $R_{12}$, $R_{13}$, $R_{14}$, $R_{15}$, and $R_{16}$ each independently represent a hydrogen atom, a linear or branched alkyl group having 6 or less carbon atoms or a phenyl group and these may be the same or different, and -A- represents a linear, branched or cyclic bivalent hydrocarbon group having 20 or less carbon atoms;

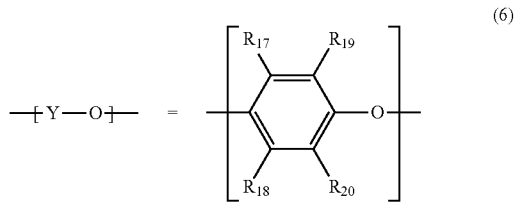

wherein $R_{17}$ and $R_{18}$ each independently represent a hydrogen atom, a linear or branched alkyl group having 6 or less carbon atoms or a phenyl group and these may be the same or different, and $R_{19}$ and $R_{20}$ each independently represent a linear or branched alkyl group having 6 or less carbon atoms or a phenyl group and these may be the same or different.

6. The resin composition according to claim 1, wherein the thioether-based polymerization inhibitor (h) is contained in an amount of 0.01 to 2 parts by mass based on 100 parts by mass of the total of the components (a) to (e).

7. The resin composition according to claim 1, wherein the bifunctional phenylene ether oligomer (a) is contained in an amount of 65 to 75 parts by mass based on 100 parts by mass of the total of the components (a) to (e).

8. The resin composition according to claim 1, wherein the aralkyl-based cyanate ester compound (b) is contained in an amount of 3 to 10 parts by mass based on 100 parts by mass of the total of the components (a) to (e).

9. The resin composition according to claim 1, wherein the bisphenol-based cyanate ester compound (c) is contained in an amount of 3 to 10 parts by mass based on 100 parts by mass of the total of the components (a) to (e).

10. The resin composition according to claim 1, wherein the epoxy resin (d) is contained in an amount of 5 to 10 parts by mass based on 100 parts by mass of the total of the components (a) to (e).

11. The resin composition according to claim 1, wherein the epoxy resin (d) has an epoxy group, the aralkyl-based cyanate ester compound (b) and the bisphenol-based cyanate ester compound (c) have a cyanato group, and
an equivalent ratio of the cyanato group in the aralkyl-based cyanate ester compound (b) and the bisphenol-based cyanate ester compound (c) to the epoxy group in the epoxy resin (d) is 1.8 to 8.0.

12. The resin composition according to claim 1, wherein the brominated carbonate oligomer (e) is contained in an amount of 10 to 15 parts by mass based on 100 parts by mass of the total of the components (a) to (e).

13. The resin composition according to claim 1, wherein the inorganic filler (f) is contained in an amount of 40 to 100 parts by mass based on 100 parts by mass of the total of the components (a) to (e).

14. A prepreg obtained by impregnating or coating a substrate with the resin composition according to claim 1.

15. A metal foil-clad laminate obtained by stacking at least one sheet of the prepreg according to claim 14, and disposing metal foil on one or both surfaces of the resultant for lamination forming.

16. A resin sheet obtained by coating a surface of a substrate with the resin composition according to claim 1 and drying the resultant, and then removing the substrate.

17. A printed-wiring board comprising an insulating layer and a conductor layer formed on a surface of the insulating layer, wherein the insulating layer comprises the resin composition according to claim 1.

* * * * *